United States Patent [19]

Keyser et al.

[11] Patent Number: 5,028,739

[45] Date of Patent: Jul. 2, 1991

[54] EMI/REI SHIELDING GASKET

[75] Inventors: Paul F. Keyser, W. Newbury, Mass.; Eivind L. Johansen, Weare, N.H.

[73] Assignee: Chomerics, Inc., Woburn, Mass.

[21] Appl. No.: 337,491

[22] Filed: Apr. 13, 1989

[51] Int. Cl.$^5$ .............................. H05K 9/00; H01S 4/00
[52] U.S. Cl. ........................... 174/35 GC; 174/35 MS; 29/592.1
[58] Field of Search .......... 174/35 R, 35 MS, 35 GC; 219/10.55 R, 10.55 D; 361/424; 29/592.1

[56] References Cited

U.S. PATENT DOCUMENTS

| | | | |
|---|---|---|---|
| 2,519,850 | 8/1950 | Pierson | 174/35 GC |
| 3,029,303 | 12/1958 | Severino | 174/97 |
| 3,132,204 | 5/1964 | Giellerup | 174/117 |
| 3,247,312 | 12/1963 | Alessi | 174/35 |
| 3,312,769 | 10/1965 | LaKaff | 174/35 |
| 3,413,406 | 11/1968 | Plummer | 174/3 |
| 3,555,168 | 6/1969 | Frykberg | 174/35 |
| 3,969,572 | 7/1976 | Rostek | 174/35 |
| 4,098,633 | 7/1978 | Kersten | 156/245 |
| 4,247,737 | 1/1981 | Johnson | 174/35 GC |
| 4,642,416 | 2/1985 | Rogner | 174/35 |
| 4,652,695 | 3/1987 | Busby | 174/35 |
| 4,720,606 | 1/1988 | Senn | 174/35 |
| 4,731,500 | 3/1988 | Otsuka | 174/36 |
| 4,791,236 | 12/1988 | Klein et al. | 174/36 |
| 4,857,668 | 8/1989 | Buonanno | 174/35 GC |

FOREIGN PATENT DOCUMENTS 2509949 1/1983 France .

OTHER PUBLICATIONS

Severinsen, Machine Design, vol. 47, No. 19 (Aug. 7, 1975).

Primary Examiner—Leo P. Picard
Assistant Examiner—Bot Lee Ledynh
Attorney, Agent, or Firm—John Dana Hubbard; Celia H. Ketley; William L. Baker

[57] ABSTRACT

An EMI/RFI shielding gasket comprising a resilient elastomeric core enveloped with a fine, open format knit or braided wire mesh, and having a strip of pressure sensitive adhesive disposed lengthwise along a surface of the gasket. This strip of adhesive allows the gasket to be removably fastened to an enclosure, circumventing the need for a metal clip and thus making the gasket lighter and less expensive than conventional gaskets.

23 Claims, 1 Drawing Sheet

EMI/REI SHIELDING GASKET

BACKGROUND OF THE INVENTION

The operation of conventional electronic equipment is typically accompanied by the generation of radio frequency and/or electromagnetic radiation in the electronic circuitry of the electronic system. If not properly shielded, such radiation can cause considerable interference with unrelated equipment. Accordingly, it is necessary to effectively shield and ground all sources of radio frequency and electromagnetic radiation within the electronic system.

In instances where the radiation-generating equipment is permanently housed in a container, effective shielding may be accomplished easily through proper construction of the enclosure. However, when the equipment housing is provided with a readily openable access panel or door, effective radio frequency interference (RFI) or electromagnetic interference (EMI) shielding presents more of a problem. Many electronic installations such as computer rooms have been made in the past without a full understanding of the effect of partially unshielded enclosures, such as access doors. Thus, manufacturers and users of older electronic equipment have attempted to upgrade the level of RFI/EMI shielding through retrofit installation of shielding devices around these access openings. To this end, it has been known to provide an RFI/EMI shielding device which may be a knitted wire mesh, knitted wire mesh over an elastomeric core, a conductive elastomeric and similar types of shielding devices. Generally, these shielding devices are attached to the housing by rivets, welds, screws, ect. Preferably, a continuous roll-formed strip metal clip, to which a shielding device has been attached, is used.

The clip is designed so that it may be placed over the edge of the door or panel and retained in place by frictional gripping action of the roll-formed clip. The configuration of the shielding device is such that the device attached to the clip, is brought into contact with a fixed surface of the enclosure when the door or panel is closed, effectively sealing off the narrow gap otherwise typically provided between a door or panel and the oppositely facing surface areas of the housing.

For radiation frequencies between 30 megahertz and 3 gigahertz, it is known to utilize conductive mesh materials, supported internally by an elastomeric core or other similar element, in order to provide adequate shielding. In the manufacture of conventional mesh shielded strips, a tubular sleeve of conductive wire is knitted in the form of a continuous tube closely about the exterior of a resilient core. Typically, this operation is performed twice, once to provide a tightly conforming inner mesh, and a second time to provide an outer tubular mesh. Both tubes surround and are supported internally by the resilient core. The thus shielded core is secured to a continuous mounting strip, clip or the like, for mounting upon the housing to be shielded. Typically, this is done by providing sufficient slack in the outer mesh layer to enable a "tail flange" to be formed of the excess material, which can be secured in some form to a mounting means. A similar application in which the knit is wrapped around the core rather than knitted over the core is also known.

While the prior art gaskets described above perform well, they are relatively costly to assemble onto the cabinet. Also, the tightly knit wire mesh necessitates that a high closure force he used to seal the door, and the combination of the tightly knit mesh and the metal clip makes the gasket heavy, which is detrimental in aerospace and other applications where weight is a critical factor.

The present invention provides a novel and greatly improved mesh covered resilient core shielding gasket, which is inexpensive and lightweight and allows a low closure force.

SUMMARY AND OBJECTS OF THE INVENTION

The gasket of the present invention comprises a resilient elastomeric core enveloped with a fine, open format knit or braided wire mesh. To this fine wire mesh is applied lengthwise a strip of pressure sensitive adhesive. This strip of pressure sensitive adhesive enables the gasket to be removably secured directly to an enclosure, circumventing the need for a metal clip.

It is an object of the invention to provide a shielding gasket which can be attached directly to an enclosure, without a clip, and subsequently easily removed for replacement.

It is a further object of the invention to provide a shielding gasket comprising an elastomer core, a wire mesh surrounding said core, and a strip of pressure sensitive adhesive disposed on a surface of the gasket parallel to its length.

Another object of the invention is to provide a shielding gasket which is lightweight and simple to manufacture.

A further object of the invention is to provide a shielding gasket which allows an enclosure door to be sealed with a low closure force.

Yet another object of the invention is to provide a shielding gasket comprising a foam core, a wire mesh surrounding said core and having less than 30 openings per inch, and a strip of pressure sensitive adhesive disposed on a surface of the gasket parallel to its length.

Additional objects and advantages will become apparent to those skilled in the art as the description proceeds in connection with the accompanying drawings.

DETAILED DESCRIPTION OF THE INVENTION

Figure 1:
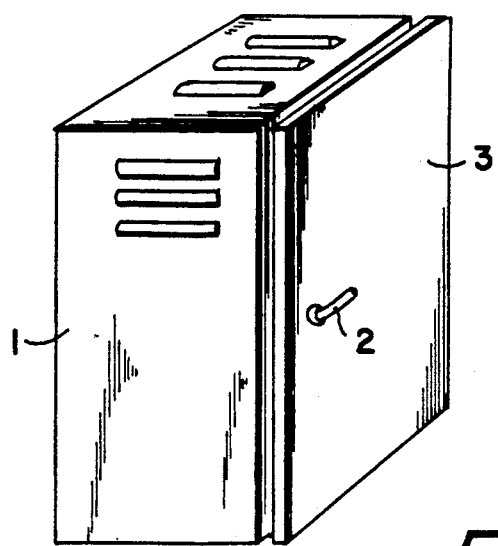
FIG. 1 is a simplified perspective illustration of a typical cabinet with access door, for housing computer

Referring to FIG. 1, there is shown a typical metallic housing 1, utilized for computer circuitry and the like. The housing is typically provided with an access door 3 having a locking handle 2 on one side and provided with a suitable hinge means (not shown) on the opposite side. For effective RFI/EMI shielding, the interface between the housing 1 and the door 3 is provided about its entire periphery with a resilient strip of shielding material. The arrangement is such that, when the door 3 is closed, the resilient shielding strip will be contacted and compressed about the entire periphery of the door to provide good electrical contact all around.

Figure 2:
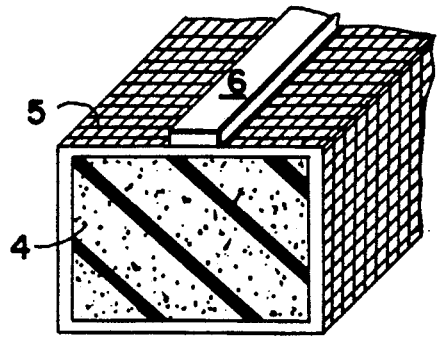
FIG. 2 is a perspective view, in cross section, of he shielding strip of the invention.

In FIG. 2 a perspective view, in cross-section, is shown of the shielding gasket of the invention. In this embodiment, a wire mesh 5 envelopes an elastomeric core 4. The core and the gasket have a length that is greater than its width. The selected length is determined by the distance of the panel to be covered by the gasket. The width can be any width conventionally used, though generally from about 0.25 to about 1.0 inch. The height of the gasket can also be any height conventionally used, but is typically approximately equal to the width. A strip of pressure sensitive adhesive 6 is disposed lengthwise on a surface of the thus formed gasket. In an alternate embodiment, a sheet of protective, releasable covering means (not shown) is provided adjacent the adhesive strip 6.

In a preferred embodiment of the invention, the wire mesh is formed of a nickel copper alloy wire such as Monel or a tin plated copper clad steel wire such as Ferrex ®. Other types of wire which can also be used include copper wire which has been plated with tin or other metals, silver plated nylon or other synthetic thread, and other suitable electrically conductive materials. In order to be able to successfully apply the strip of pressure sensitive adhesive to the mesh surface, it is necessary to control both the thickness of the wire and the tightness of the knit. For optimal results, the wire is typically of a thickness of less than about 0.0050 inches, and preferably less than about 0.0045 inches. The tightness of the knit is generally controlled such that the wire is knit in an open format, having less than about 35 openings per inch, and preferably less than about 30 openings per inch.

The elastomeric core 4 may be formed from a variety of materials known in the gasket art. In a preferred embodiment, the core is of an elastomeric foam, such as a foamed elastomeric thermoplastic, foamed neoprene, foamed urethane or foamed silicone. This foam may be open or closed cell and may have a skinned surface if desired. Conventional unfoamed neoprenes, urethanes, silicones, thermoplastic elastomers and other suitable materials in solid or hollow form may also be used. The core may be electrically conductive or nonconductive, as dictated by cost and shielding requirements.

The pressure sensitive adhesive is generally applied in tape form. It is preferred to use a double sided tape or an adhesive with the elastomer core, the tape may be applied by hand, or using up to about 20 psi nip roll pressure to promote bonding of the adhesive to the core. It is preferred that the adhesive be electrically conductive, in order to ensure optimal shielding. However, conventional pressure sensitive adhesives may be used as appropriate.

In one embodiment, the adhesive strip is provided with a protective, releasable covering means. This may be a siliconized paper or release film, or other conventional releasable covering material, and serves to protect the adhesive from contamination and facilitate storage and application of the gasket.

In another embodiment, a wide metal foil having pressure sensitive adhesive, preferably conductive, is applied to the gasket. The foil has a length that is greater than its width, however it is preferred that the width of the foil be greater than the width of the gasket. Preferably, the width of the foil is from two to four times the width of the gasket. The metal foil provides a larger "footprint" between the gasket and the surface to which it is bonded. The metal foil also tends to aid in the handling and placement of the gasket. Suitable metal foils include but are not limited to tinned copper, copper, aluminum, stainless steel, nickel, nickel plated metals, noble metal plated non-noble metals, such as silver coated copper, noble metals such as silver, and other such electrically conductive metal foils. The foil thickness should be sufficient to allow the foil to support the gasket. Generally, a metal foil having a thickness from about 1 to about 10 mils is preferred, and more preferably a foil of from about 1 to about 3 mils.

In a further embodiment, the gasket is designed so that it requires a low closure force to form a EMI/RFI shield. By "low closure force" it is meant that the force required to close the door or panel while obtaining the necessary deflection of the gasket so as to ensure proper electrical mating of the door to the frame through the gasket is less than five pounds per linear inch. Preferably, the core of the gasket is formed of a light, highly resilient and conformable polyurethane foam which has a required closure force of one pound per linear inch or less.

Figure 3:
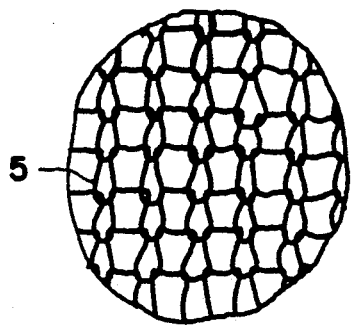
FIG. 3 is a highly enlarged view of a selected area of FIG. 2, illustrating details of the wire mesh in one embodiment of the invention.

In FIG. 3 is shown the structure of mesh 5 in one embodiment of the invention. In this embodiment the wire is knit in an open format. In an alternate embodiment the wire may be braided. Both braiding and knitting of wire mesh is typically performed using equipment designed for this purpose and known to those skilled in the art.

While the mesh is shown as being knit or braided over the core, it can also be formed separately and wrapped around the core as is well known int he art. In that instance, one must make sure that the ends of the mesh are properly secured to each other or the gasket surface.

After manufacture of the gasket described above, the gasket would be applied around the periphery of an access door or the opening of an enclosure. The gasket could also be used in other shielding applications in which it could be useful. The gasket would typically be applied by stripping the release film (if present) from the adhesive and then pressing the adhesive strip against the substrate to which the gasket is applied. When the gasket requires replacement it can be easily removed by peeling it from the enclosure surface.

While preferred embodiments of this invention have been described in detail hereinabove, it is to be understood that many changes and modifications may be made by those skilled in the art without departing from the scope and spirit of this invention.

What is claimed is:

1. A shielding gasket comprising:
   a) an elastomer core;
   b) a wire mesh knitted or braided over said core; and
   c) a strip of pressure sensitive adhesive disposed on the surface of the gasket parallel to its length, in a manner such that the pressure sensitive adhesive bonds to the core through the mesh thereby securing the mesh to the core.

2. The shielding gasket of claim 1 further comprising a releasable protective covering means adjacent said adhesive strip.

3. The shielding gasket of claim 1, wherein said mesh is formed from wire having a diameter of less than about 0.0050 inches.

4. The shielding gasket of claim 1, wherein said mesh is a knit fabric having less than about 35 openings per inch.

5. The shielding gasket of claim 1, wherein said core is of a material selected from the group consisting of: elastomeric thermoplastics, neoprene rubber, silicone, urethane, foamed elastomeric thermoplastics, neoprene rubber, foamed silicone and foamed urethane.

6. The shielding gasket of claim 1, wherein said core is formed of a solid silicone elastomer.

7. The shielding gasket of claim 1, wherein said adhesive strip is electrically conductive.

8. The shielding gasket of claim 1 wherein the elastomer core is a foamed urethane elastomer and the wire mesh is silver plated nylon.

9. A method of shielding an enclosure comprising the steps of:
   a) forming a shielding gasket by a process comprising the sequential steps of:
      i. providing an elastomer core;
      ii. knitting or braiding a wire mesh over and surrounding said core; and
      iii. applying strip of pressure sensitive adhesive to said gasket, parallel to its length, in a manner such that the pressure sensitive adhesive bonds to the core through the mesh, thereby securing the mesh to the core; and
   b) adhering said gasket to the surface of said enclosure via the pressure sensitive adhesive.

10. The method of claim 9 wherein said adhesive is electrically conductive.

11. The method of claim 9 wherein the elastomer core is a formed urethane elastomer and the wire mesh is silver plated nylon.

12. An EMI/RFI shielding gasket comprising:
    a) a resilient elastomeric core;
    b) a conductive metal mesh surrounding the core;
    c) a metal foil strip the length of which is greater than its width, said strip having a pressure sensitive adhesive on its surfaces, and one surface of the metal foil strip being in contact with and bonded to the core by the pressure sensitive adhesive.

13. The EMI/RFI shielding gasket of claim 12 wherein the core is seleted from the group consisting of: elastomeric thermoplastics, neoprene rubber, silicone, urethane, foamed elastomeric thermoplastics, foamed neoprene rubber, foamed silicone and foamed urethane; the mesh is a woven or briaded material having less than 35 openings per square inch; and the metal foil strip is selected from the group consisting of tinned copper, copper, stainless steel, noble metal plated non and noble metals, noble metals.

14. The EMI/RFI shielding gasket of claim 12 wherein the pressure sensitive adhesive is electrically conductive.

15. A method of shielding an enclosure comprising the steps of:
    a) forming a shielding gasket by a process comprising the sequential steps of:
       i. providing a resilient elastomer core;
       ii. knitting or braiding a conductive metal mesh over and surrounding the core; and
       iii. applying to said gasket a metal foil strip the length of which is greater than its width, said foil strip having a pressure sensitive adhesive on at least two of its surfaces, such that one surface of the foil strip is bonded through the mesh to the core by the pressure sensitive adhesive; and b) adhering said gasket to the surface of said enclosure via the pressure sensitive adhesive on the other surface of the foil strip.

16. The method of claim 15 wherein the core is selected from the group consisting of urethane, elastomeric thermoplastics, neoprene rubber, silicone, and foams thereof; the mesh is a woven or braided material having less than 35 openings per square inch; and the metal foil strip is selected from the group consisting of tinned copper, copper, stainless steel, and noble metal plated non-noble metals.

17. The method of claim 15 wherein the pressure sensitive adhesive is electrically conductive.

18. A shielding gasket comprising:
    a) an elastomeric core;
    b) a wire mesh knitted or braided over and surrounding said core; and
    c) a strip of pressure sensitive adhesive disposed on a surface of the gasket, parallel to its length, such that the adhesive bonds the mesh to the core;
    wherein the wire mesh is a knit fabric having less than about 35 openings per inch and is formed from wire having a thickness of less than 0.005 inches.

19. The shielding gasket of claim 18 wherein the elastomeric core is a foamed urethane elastomer and the wire mesh is silver plated nylon.

20. A shielding gasket produced by a process comprising the sequential steps of:
    a) providing an elastomeric core;
    b) knitting or braiding a wire mesh over and surrounding said core; and
    c) applying a strip of pressure sensitive adhesive to said gasket, parallel to its length, in a manner such that the pressure sensitive adhesive bonds to the core through the mesh, securing the mesh to the core.

21. A gasket of claim 20 wherein said mesh is formed from wire having a diameter of less than about 0.0050 inches.

22. A gasket of claim 20 wherein said mesh is a knit fabric having less than about 35 openings per square inch.

23. The gasket of claim 20 wherein the elastomeric core is a foamed urethane elastomer and the wire mesh is silver plated nylon.

* * * * *

UNITED STATES PATENT AND TRADEMARK OFFICE
CERTIFICATE OF CORRECTION

PATENT NO. : 5,028,739
DATED : July 2, 1991
INVENTOR(S) : Paul Keyser, et. al.

It is certified that error appears in the above-identified patent and that said Letters Patent is hereby corrected as shown below:

In the Title: On the title page, and col. 1, change "REI" to --RFI--.

Signed and Sealed this

Fifteenth Day of December, 1992

Attest:

DOUGLAS B. COMER

*Attesting Officer*     *Acting Commissioner of Patents and Trademarks*